US010860959B2

(12) United States Patent
Kopp

(10) Patent No.: US 10,860,959 B2
(45) Date of Patent: Dec. 8, 2020

(54) METHOD AND SYSTEM FOR RANKING CONTROL SCHEMES OPTIMIZING PEAK LOADING CONDITIONS OF BUILT ENVIRONMENT

(71) Applicant: Conectric, LLC, Lewes, DE (US)

(72) Inventor: Phillip Kopp, San Diego, CA (US)

(73) Assignee: CONECTRIC, LLC, Lewes, DE (US)

( * ) Notice: Subject to any disclaimer, the term of this patent is extended or adjusted under 35 U.S.C. 154(b) by 658 days.

(21) Appl. No.: 15/590,205

(22) Filed: May 9, 2017

(65) Prior Publication Data

US 2017/0331287 A1   Nov. 16, 2017

Related U.S. Application Data

(60) Provisional application No. 62/334,367, filed on May 10, 2016.

(51) Int. Cl.
*G06Q 10/06* (2012.01)
*G05B 15/02* (2006.01)
(Continued)

(52) U.S. Cl.
CPC ........ *G06Q 10/06312* (2013.01); *F24F 11/30* (2018.01); *F24F 11/62* (2018.01); *G01R 1/36* (2013.01); *G05B 13/041* (2013.01); *G05B 15/02* (2013.01); *G05B 19/042* (2013.01); *G05B 23/024* (2013.01); *G05B 23/0243* (2013.01); *G05B 23/0281* (2013.01); *G05B 23/0294* (2013.01); *G05F 1/66* (2013.01); *G06F 1/26* (2013.01); *G06F 17/18* (2013.01);
(Continued)

(58) Field of Classification Search
CPC ..... G06Q 10/06312; H02J 50/80; F24F 11/62
See application file for complete search history.

(56) References Cited

U.S. PATENT DOCUMENTS 6,968,295 B1    11/2005   Carr
7,664,573 B2    2/2010    Ahmed
(Continued)

FOREIGN PATENT DOCUMENTS

EP         2708403 A2 *   3/2014

*Primary Examiner* — Kenneth M Lo
*Assistant Examiner* — Istiaque Ahmed
(74) *Attorney, Agent, or Firm* — Procopio, Cory, Hargreaves & Savitch LLP; Noel C. Gillespie

(57) ABSTRACT

The present disclosure provides a computer-implemented method for ranking one or more control schemes for controlling peak loading conditions and abrupt changes in energy pricing of one or more built environments associated with renewable energy sources. The computer-implemented method includes analysis of a first set of statistical data, a second set of statistical data, a third set of statistical data, a fourth set of statistical data and a fifth set of statistical data. Further, the computer-implemented method includes identification and execution of the one or more control schemes. In addition, the computer-implemented method includes scoring the one or more control schemes by evaluating a probabilistic score. Further, the computer-implemented method includes ranking the one or more control schemes to determine relevant control schemes for controlling real time peak loading conditions and abrupt changes in energy pricing associated with the one or more built environments.

20 Claims, 5 Drawing Sheets

(51) Int. Cl.

| | | |
|---|---|---|
| *G05F 1/66* | (2006.01) | |
| *H02J 3/14* | (2006.01) | |
| *G06F 17/18* | (2006.01) | |
| *G06Q 50/06* | (2012.01) | |
| *G05B 19/042* | (2006.01) | |
| *G05B 13/04* | (2006.01) | |
| *H02J 3/00* | (2006.01) | |
| *H02J 9/06* | (2006.01) | |
| *H02J 15/00* | (2006.01) | |
| *H02J 3/38* | (2006.01) | |
| *G06F 1/26* | (2006.01) | |
| *H02J 13/00* | (2006.01) | |
| *F24F 11/62* | (2018.01) | |
| *F24F 11/30* | (2018.01) | |
| *G05B 23/02* | (2006.01) | |
| *H02J 50/80* | (2016.01) | |
| *H02J 3/32* | (2006.01) | |
| *G01R 1/36* | (2006.01) | |

(52) U.S. Cl.
CPC ............... *G06Q 50/06* (2013.01); *H02J 3/00* (2013.01); *H02J 3/008* (2013.01); *H02J 3/14* (2013.01); *H02J 3/32* (2013.01); *H02J 3/38* (2013.01); *H02J 3/382* (2013.01); *H02J 9/061* (2013.01); *H02J 13/00012* (2020.01); *H02J 13/0017* (2013.01); *H02J 13/0075* (2013.01); *H02J 13/0086* (2013.01); *H02J 15/00* (2013.01); *H02J 50/80* (2016.02); *G05B 2219/24048* (2013.01); *G05B 2219/2639* (2013.01); *H02J 3/003* (2020.01); *H02J 3/383* (2013.01); *H02J 3/386* (2013.01); *H02J 2203/20* (2020.01); *H02J 2300/30* (2020.01); *H02J 2310/64* (2020.01); *Y02B 70/3225* (2013.01); *Y02E 10/563* (2013.01); *Y02E 10/566* (2013.01); *Y02E 10/763* (2013.01); *Y02E 40/72* (2013.01); *Y02E 40/76* (2013.01); *Y02E 70/30* (2013.01); *Y04S 10/123* (2013.01); *Y04S 10/54* (2013.01); *Y04S 10/545* (2013.01); *Y04S 10/60* (2013.01); *Y04S 20/222* (2013.01); *Y04S 20/224* (2013.01)

(56) References Cited

U.S. PATENT DOCUMENTS

| | | |
|---|---|---|
| 8,457,802 B1 | 6/2013 | Steven et al. |
| 8,706,650 B2 | 4/2014 | Ozog |
| 8,799,481 B2 | 8/2014 | Chamarti et al. |
| 8,825,217 B2 | 9/2014 | Borrett et al. |
| 9,160,169 B2 | 10/2015 | Hanks et al. |
| 9,244,444 B2 | 1/2016 | Carty et al. |
| 9,906,029 B2 | 2/2018 | Grohman |
| 9,960,637 B2 | 5/2018 | Sanders et al. |
| 10,198,017 B2 | 2/2019 | Chamarti et al. |
| 10,198,703 B2 | 2/2019 | Kopp |
| 10,241,505 B2 | 3/2019 | Cohen et al. |
| 10,289,017 B2 | 5/2019 | Otake |
| 2006/0103549 A1 | 5/2006 | Hunt et al. |
| 2010/0138363 A1* | 6/2010 | Batterberry ............ G06Q 10/04 705/412 |
| 2010/0235004 A1* | 9/2010 | Thind .................... G05B 15/02 700/277 |
| 2011/0169334 A1 | 7/2011 | Williams |
| 2011/0231028 A1* | 9/2011 | Ozog ..................... G06Q 10/06 700/291 |
| 2011/0239013 A1 | 9/2011 | Muller |
| 2012/0232701 A1* | 9/2012 | Carty .................... G05B 15/02 700/277 |
| 2012/0239213 A1* | 9/2012 | Nagata ................. G06Q 10/04 700/291 |
| 2012/0245751 A1 | 9/2012 | Gow et al. |
| 2012/0245752 A1* | 9/2012 | Borrett .................. G06Q 10/06 700/295 |
| 2012/0296482 A1 | 11/2012 | Steven et al. |
| 2012/0316808 A1 | 12/2012 | Frader-Thompson et al. |
| 2013/0000342 A1 | 1/2013 | Blasko et al. |
| 2013/0013121 A1 | 1/2013 | Henze et al. |
| 2013/0218355 A1 | 8/2013 | Lazaris |
| 2014/0039710 A1 | 2/2014 | Carter et al. |
| 2014/0141290 A1 | 5/2014 | Pizzurro et al. |
| 2014/0222225 A1 | 8/2014 | Rouse et al. |
| 2014/0257584 A1 | 9/2014 | Tanimoto et al. |
| 2014/0277769 A1* | 9/2014 | Matsuoka ........... H04L 12/2818 700/278 |
| 2014/0303935 A1 | 10/2014 | Kamel et al. |
| 2015/0057820 A1* | 2/2015 | Kefayati ................ G06Q 50/06 700/291 |
| 2016/0104486 A1 | 4/2016 | Penilla et al. |
| 2016/0124411 A1 | 5/2016 | Tinnakornsrisuphap et al. |
| 2016/0190805 A1* | 6/2016 | Steven ............... G06Q 30/0283 700/291 |
| 2016/0248251 A1 | 8/2016 | Tinnakornsrisuphap et al. |
| 2017/0104449 A1* | 4/2017 | Drees ..................... G01W 1/10 |
| 2017/0115650 A1* | 4/2017 | Holleran ................ G06Q 50/06 |
| 2017/0177766 A1 | 6/2017 | Song et al. |
| 2018/0107260 A1 | 4/2018 | Cifala et al. |
| 2018/0231967 A1 | 8/2018 | Cohen et al. |
| 2018/0239311 A1* | 8/2018 | Haslett ................. G05B 13/028 |

* cited by examiner

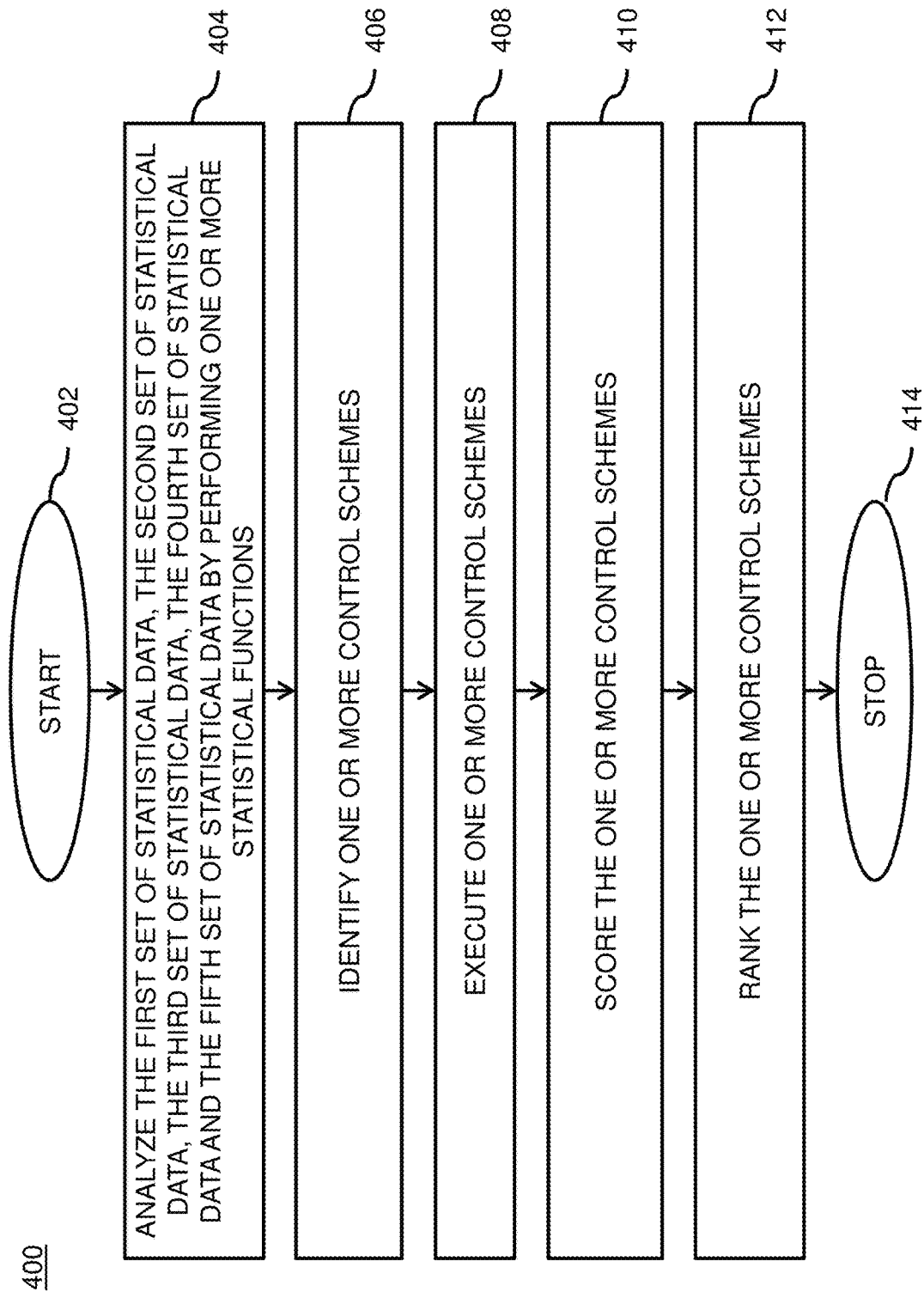

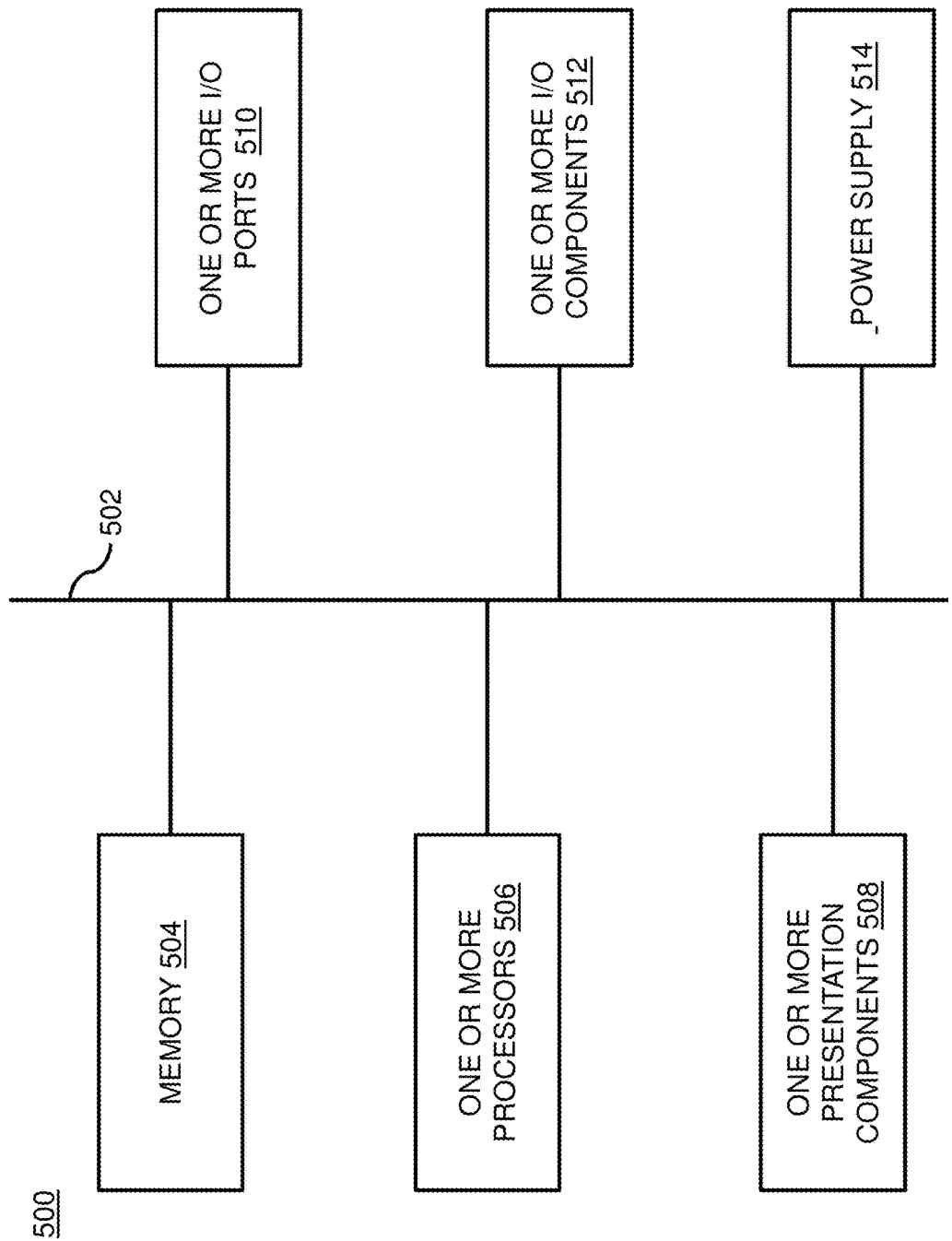

METHOD AND SYSTEM FOR RANKING CONTROL SCHEMES OPTIMIZING PEAK LOADING CONDITIONS OF BUILT ENVIRONMENT

CROSS-REFERENCES TO RELATED APPLICATION

The present application claims the benefit under 35 U.S.C. § 119(e) of the filing date of U.S. Provisional Patent Application Ser. No. 62/334,367 for PHILLIP KOPP, filed May 10, 2016, which is hereby incorporated by reference in its entirety for all purposes.

TECHNICAL FIELD

The present disclosure relates to a field of energy management system. More specifically, the present disclosure relates to a method and system for ranking of one or more control schemes to control peak loading conditions and abrupt changes in energy pricing associated with one or more built environments.

BACKGROUND

Over the last few decades, increasing population and energy requirements to power modern transportation and electronic technologies result in a rapid development in energy generation and distribution technology. In order to meet the energy generation and distribution requirements, energy utilities depend mostly on the non-renewable energy sources like fossil fuels which produce a high amount of carbon emissions. Refinement processes of fossil fuels and/or its by-products and their combustion to drive electric generators have contributed as one of the major cause of excessive carbon emissions. The release of carbon and other chemical by-products into the atmosphere has impacted temperatures and climate patterns on a global scale. The increased awareness of the impacts of carbon emissions from the use of fossil fueled electric generation along with the increased cost of producing high power during peak load conditions has increased the need for alternative solutions. These alternative solutions are referred to as renewable energy sources, which may be used to generate electricity. These renewable energy sources may be applied to electric drive trains, electric automation and transportation, without the need to extract, transport, refine, combust, and release carbon-based fossil fuels. Renewable energy comes in many forms, but significantly is generated by capturing energy from natural, non-carbon intensive sources such as wind, sunlight, water movement, geothermal and other new sources as they are discovered and improved. Unlike fossil fuels and/or its by-products, these renewable energy sources are complex in nature as they are intermittent and cannot be controlled actively by humans. This enhances the probability of occurrence of certain time periods where power production far exceeds demands or certain time periods where power production falls short of demands. This creates major challenges for energy utilities to make investments, generate power for sale and profit. Also, this creates major challenges for the markets in establishing a price of energy for consumers. Nowadays, energy storage means are deployed to store energy when power production is excessive and release energy when demands exceed power production output. These energy storage means include but may not be limited to batteries and sophisticated power banks. However, there are many limitations to the effective installation of the energy storage means due to sizing requirements, specific load profiles and other attributes which must be matched very carefully in order to provide feasible economic returns.

SUMMARY

In a first example, a computer-implemented method is provided. The computer-implemented method ranks one or more control schemes to control peak loading conditions and abrupt changes in energy pricing associated with one or more built environments. The computer-implemented method may include a first step of analysis of a first set of statistical data, a second set of statistical data, a third set of statistical data, a fourth set of statistical data and a fifth set of statistical data. The first set of statistical data may be associated with a plurality of energy consuming devices and the second set of statistical data may be associated with an occupancy behavior of a plurality of users. The third set of statistical data may be associated with a plurality of energy storage and supply means, the fourth set of statistical data may be associated with a plurality of environmental sensors. The fifth set of statistical data may be associated with a plurality of energy pricing models. In addition, the computer-implemented method may include a second step of identification of one or more control schemes for controlling the peak loading conditions and abrupt changes in energy pricing associated with the one or more built environments. Moreover, the computer-implemented method may include a third step of executing one or more control schemes to counter the peak loading conditions and the abrupt changes in energy pricing associated with the one or more built environments. Further, the computer-implemented method may include a fourth step of scoring the one or more control schemes executed to counter the peak loading conditions and abrupt changes in the energy pricing associated with the one or more built environments. Furthermore, the computer-implemented method may include a fifth step to rank the one or more control schemes. The one or more control schemes are ranked for controlling peak loading conditions and abrupt changes in energy pricing associated with one or more built environments. The analysis may be performed for determination of optimized operating states of the plurality of energy consuming devices and the plurality of energy storage and supply means. The analysis may be done by performing one or more statistical functions to generate a plurality of statistical results. The one or more control schemes may be identified based on the plurality of statistical results. The one or more control schemes may include potential operational and non-operational instructions for optimization of the operating state of the plurality of energy consuming devices and the plurality of energy storage and supply means. The one or more control schemes may be executed to measure a potential improvement or degradation in estimated performance of the plurality of energy consuming devices and the plurality of energy storage and supply means. The scoring may be performed by evaluation of a probabilistic score corresponding to each of the one or more control schemes. The probabilistic score is evaluated for determination of the potential improvement and degradation in estimated performance of the plurality of energy consuming devices and the plurality of energy storage and supply means. The one or more control schemes may be scored based on a potential impact on control and regulation of peak loading conditions and abrupt changes in the energy pricing. The scoring may be performed in real time. The one or more control schemes may be ranked based on the probabilistic score corresponding to each of the one or more control schemes. The ranking may be performed in real time.

In a second example, a computer system is provided. The computer system may include one or more processors and a memory coupled to the one or more processors. The memory may store instructions which, when executed by the one or more processors, may cause the one or more processors to perform a method. The method ranks one or more control schemes to control peak loading conditions and abrupt changes in energy pricing associated with one or more built environments. The method may include a first step of analysis of a first set of statistical data, a second set of statistical data, a third set of statistical data, a fourth set of statistical data and a fifth set of statistical data. The first set of statistical data may be associated with a plurality of energy consuming devices and the second set of statistical data may be associated with an occupancy behavior of a plurality of users. The third set of statistical data may be associated with a plurality of energy storage and supply means, the fourth set of statistical data may be associated with a plurality of environmental sensors. The fifth set of statistical data may be associated with a plurality of energy pricing models. In addition, the method may include a second step of identification of one or more control schemes for controlling the peak loading conditions and abrupt changes in energy pricing associated with the one or more built environments. Moreover, the method may include a third step of executing one or more control schemes to counter the peak loading conditions and the abrupt changes in energy pricing associated with the one or more built environments. Further, the method may include a fourth step of scoring the one or more control schemes executed to counter the peak loading conditions and abrupt changes in the energy pricing associated with the one or more built environments. Furthermore, the method may include a fifth step to rank the one or more control schemes. The one or more control schemes are ranked for controlling peak loading conditions and abrupt changes in energy pricing associated with one or more built environments. The analysis may be performed for determination of optimized operating states of the plurality of energy consuming devices and the plurality of energy storage and supply means. The analysis may be done by performing one or more statistical functions to generate a plurality of statistical results. The one or more control schemes may be identified based on the plurality of statistical results. The one or more control schemes may include potential operational and non-operational instructions for optimization of the operating state of the plurality of energy consuming devices and the plurality of energy storage and supply means. The one or more control schemes may be executed to measure a potential improvement or degradation in estimated performance of the plurality of energy consuming devices and the plurality of energy storage and supply means. The scoring may be performed by evaluation of a probabilistic score corresponding to each of the one or more control schemes. The probabilistic score is evaluated for determination of the potential improvement and degradation in estimated performance of the plurality of energy consuming devices and the plurality of energy storage and supply means. The one or more control schemes may be scored based on a potential impact on control and regulation of peak loading conditions and abrupt changes in the energy pricing. The scoring may be performed in real time. The one or more control schemes may be ranked based on the probabilistic score corresponding to each of the one or more control schemes. The ranking may be performed in real time.

In a third example, a computer-readable storage medium is provided. The computer-readable storage medium encodes computer executable instructions that, when executed by at least one processor, performs a method. The method ranks one or more control schemes to control peak loading conditions and abrupt changes in energy pricing associated with one or more built environments. The method may include a first step of analysis of a first set of statistical data, a second set of statistical data, a third set of statistical data, a fourth set of statistical data and a fifth set of statistical data. The first set of statistical data may be associated with a plurality of energy consuming devices and the second set of statistical data may be associated with an occupancy behavior of a plurality of users. The third set of statistical data may be associated with a plurality of energy storage and supply means, the fourth set of statistical data may be associated with a plurality of environmental sensors. The fifth set of statistical data may be associated with a plurality of energy pricing models. In addition, the method may include a second step of identification of one or more control schemes for controlling the peak loading conditions and abrupt changes in energy pricing associated with the one or more built environments. Moreover, the method may include a third step of executing one or more control schemes to counter the peak loading conditions and the abrupt changes in energy pricing associated with the one or more built environments. Further, the method may include a fourth step of scoring the one or more control schemes executed to counter the peak loading conditions and abrupt changes in the energy pricing associated with the one or more built environments. Furthermore, the method may include a fifth step to rank the one or more control schemes. The one or more control schemes are ranked for controlling peak loading conditions and abrupt changes in energy pricing associated with one or more built environments. The analysis may be performed for determination of optimized operating states of the plurality of energy consuming devices and the plurality of energy storage and supply means. The analysis may be done by performing one or more statistical functions to generate a plurality of statistical results. The one or more control schemes may be identified based on the plurality of statistical results. The one or more control schemes may include potential operational and non-operational instructions for optimization of the operating state of the plurality of energy consuming devices and the plurality of energy storage and supply means. The one or more control schemes may be executed to measure a potential improvement or degradation in estimated performance of the plurality of energy consuming devices and the plurality of energy storage and supply means. The scoring may be performed by evaluation of a probabilistic score corresponding to each of the one or more control schemes. The probabilistic score is evaluated for determination of the potential improvement and degradation in estimated performance of the plurality of energy consuming devices and the plurality of energy storage and supply means. The one or more control schemes may be scored based on a potential impact on control and regulation of peak loading conditions and abrupt changes in the energy pricing. The scoring may be performed in real time. The one or more control schemes may be ranked based on the probabilistic score corresponding to each of the one or more control schemes. The ranking may be performed in real time.

BRIEF DESCRIPTION OF THE FIGURES

Figure 1:
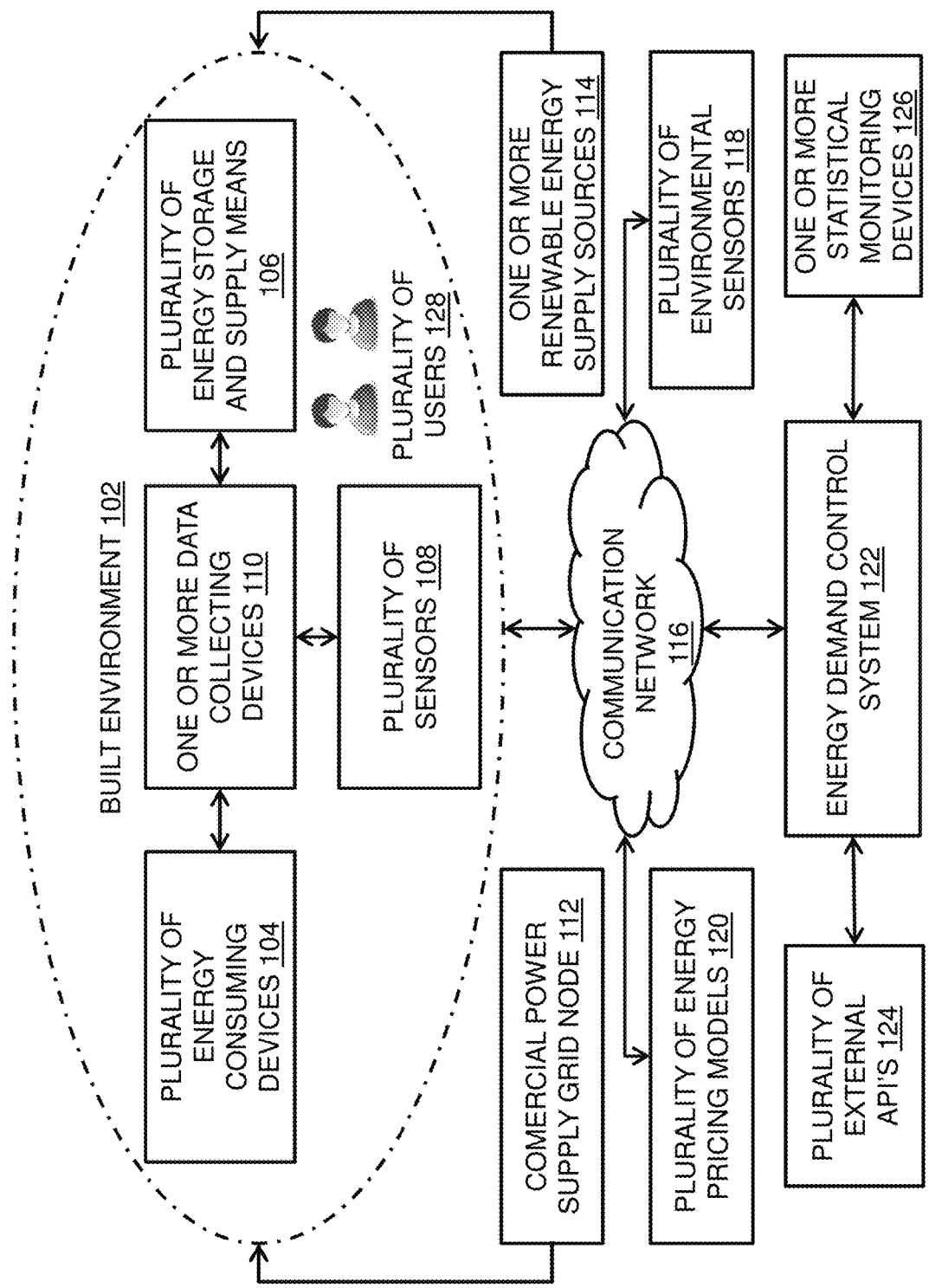
Figure 2:
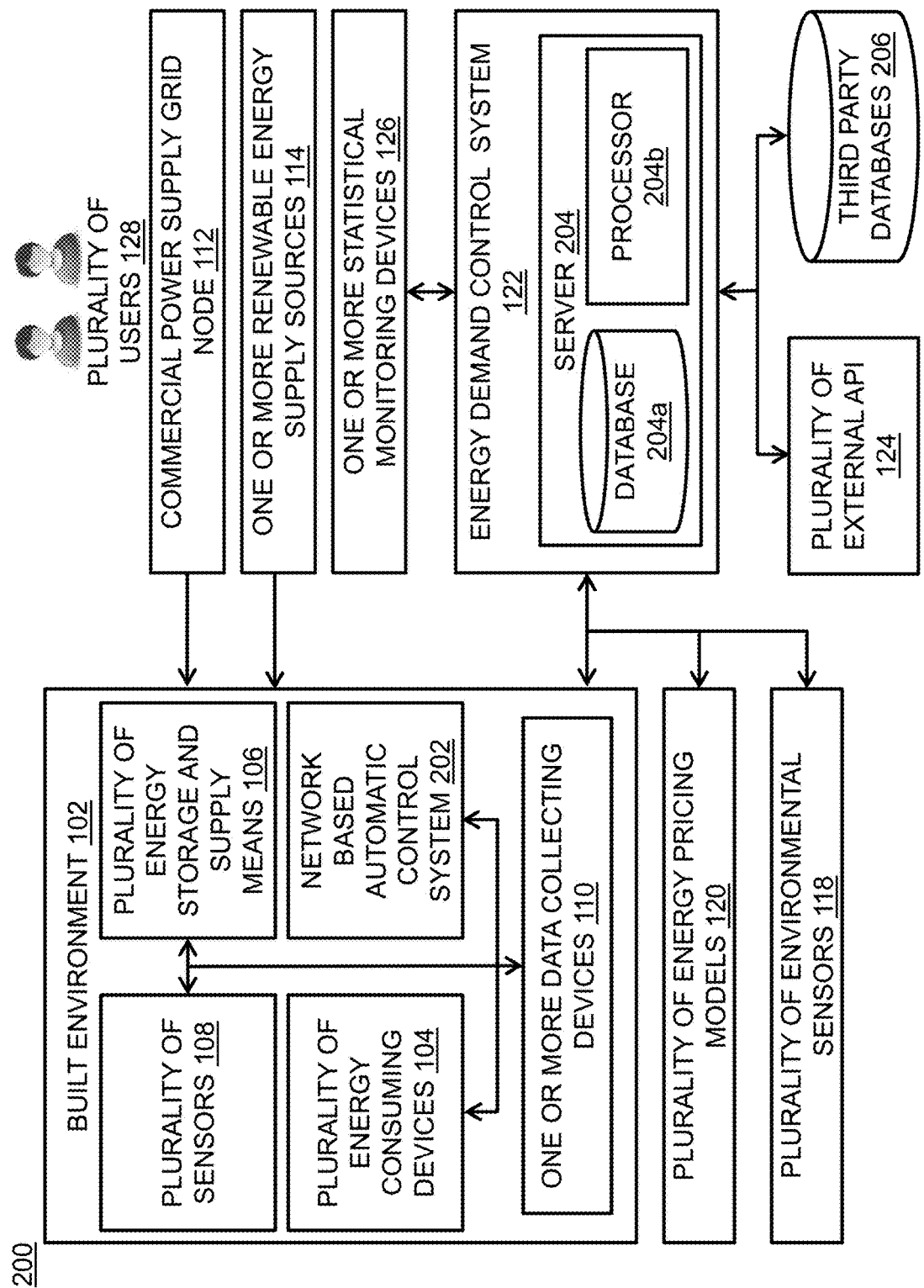
Figure 3:
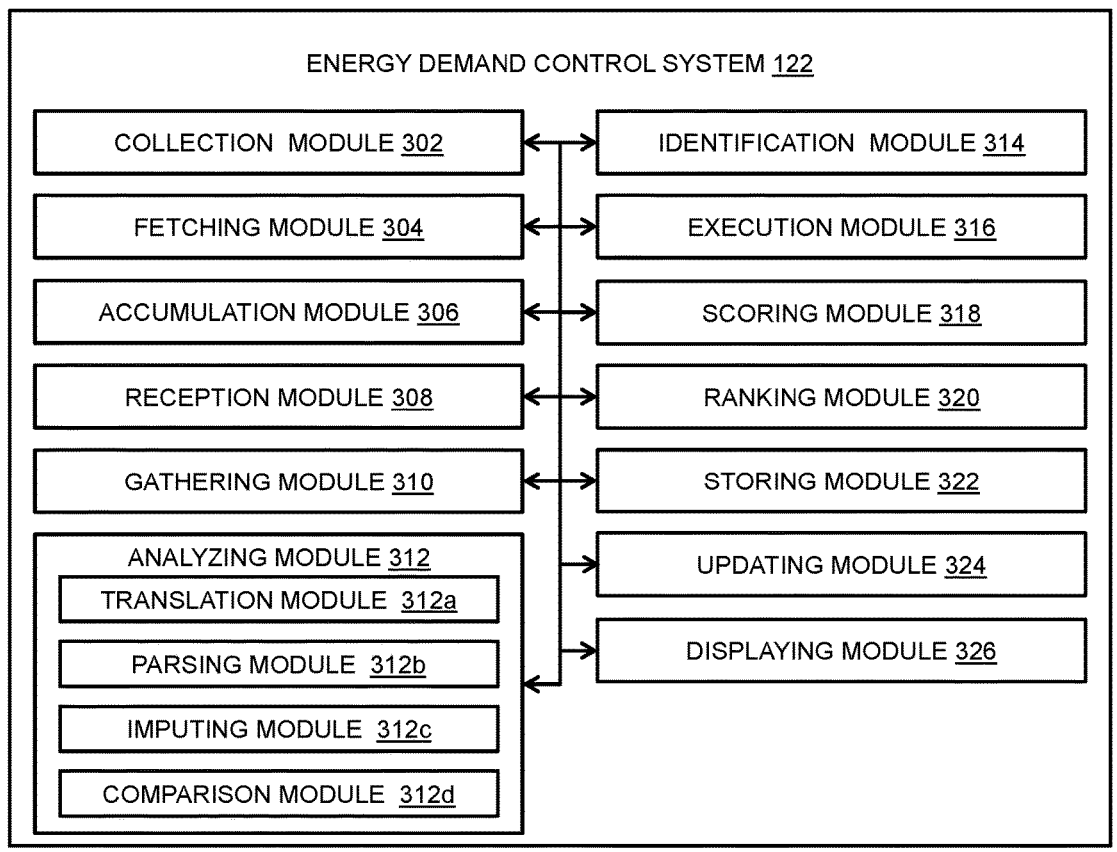

Having thus described the invention in general terms, reference will now be made to the accompanying drawings, which are not necessarily drawn to scale, and wherein:

FIG. 1 illustrates an interactive environment for ranking of one or more control schemes to control peak loading conditions and abrupt changes in energy pricing associated with one or more built environments, in accordance with various embodiments of the present disclosure;

FIG. 2 illustrates a block diagram for ranking of the one or more control schemes to control peak loading conditions and abrupt changes in energy pricing, in accordance with various embodiments of the present disclosure;

FIG. 3 illustrates a block diagram of an energy demand control system, in accordance with various embodiments of the present disclosure;

FIG. 4 illustrates a flow chart for ranking of the one or more control schemes, in accordance with various embodiments of the present disclosure; and FIG. 5 illustrates a block diagram of a communication device, in accordance with various embodiments of the present disclosure.

It should be noted that the accompanying figures are intended to present illustrations of exemplary embodiments of the present disclosure. These figures are not intended to limit the scope of the present disclosure. It should also be noted that accompanying figures are not necessarily drawn to scale.

DETAILED DESCRIPTION

In the following description, for purposes of explanation, numerous specific details are set forth in order to provide a thorough understanding of the present technology. It will be apparent, however, to one skilled in the art that the present technology can be practiced without these specific details. In other instances, structures and devices are shown in block diagram form only in order to avoid obscuring the present technology.

Reference in this specification to "one embodiment" or "an embodiment" means that a particular feature, structure, or characteristic described in connection with the embodiment is included in at least one embodiment of the present technology. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Moreover, although the following description contains many specifics for the purposes of illustration, anyone skilled in the art will appreciate that many variations and/or alterations to said details are within the scope of the present technology. Similarly, although many of the features of the present technology are described in terms of each other, or in conjunction with each other, one skilled in the art will appreciate that many of these features can be provided independently of other features. Accordingly, this description of the present technology is set forth without any loss of generality to, and without imposing limitations upon, the present technology.

FIG. 1 illustrates an interactive environment for ranking of one or more control schemes to control peak loading conditions and abrupt changes in energy pricing associated with one or more built environments, in accordance with various embodiment of the present disclosure. The interactive environment facilitates assimilation and analysis of energy conditions associated with the one or more built environments. The energy conditions include but may not be limited to energy demand, energy consumption, energy expenses and energy use intensity. The energy conditions are utilized for identification and ranking of the one or more control schemes for controlling peak loading conditions and abrupt changes in energy pricing associated with the one or more built environments.

The interactive environment is characterized by the interaction of a built environment 102, a plurality of energy consuming devices 104, a plurality of energy storage and supply means 106, a plurality of sensors 108 and one or more data collecting devices 110. In addition, the interactive environment is characterized by the interaction of a commercial power supply grid node 112, one or more renewable energy supply sources 114 and a communication network 116. Furthermore, the interactive environment is characterized by the interaction of a plurality of environmental sensors 118 and a plurality of energy pricing models 120. Moreover, the interactive environment is characterized by the interaction of an energy demand control system 122, a plurality of external application program interfaces 124 (hereafter "APIs") and one or more statistical monitoring devices 126.

In general, the built environment 102 is a closed or semi-closed structure with one or more number of floors utilized for specific purposes. Each built environment are utilized to perform a pre-defined operations and maintenance based on types of services provided by the built environment 102. The types of services include hospitality, travel, work, entertainment, manufacturing and the like. In addition, each type of service provided decides a scale of the operations and maintenance of the built environment 102. The type of services and the maintenance pertains to the energy consumption associated with each of the plurality of energy consuming devices 104. Examples of the built environment 102 includes but may not be limited to an office, a mall, an airport, a stadium, a hotel and a manufacturing plant.

The built environment 102 utilizes energy for operations and maintenance of the built environment 102. The built environment 102 obtains the energy from a plurality of energy generation and supply sources. The plurality of energy generation and supply sources include but may not be limited to the commercial power supply grid node 112 and the one or more renewable energy supply sources 114. The commercial power supply grid node 112 corresponds to a network of power lines, a plurality of transformers and one or more equipment employed for the transmission and distribution of the alternate current power to the built environment 102. Further, the one or more renewable energy supply sources 114 include but may not be limited to one or more windmills and a plurality solar photovoltaic panels.

In an embodiment of the present disclosure, the one or more renewable energy supply sources 114 are deployed at the built environment 102. In an example, the plurality of solar photovoltaic panels are installed at the residential or commercial rooftops. In another embodiment of the present disclosure, the one or more renewable energy supply sources 114 are deployed at a remote location from the built environment 102. In an example, the one or more windmills are deployed at countryside farmland. In an embodiment of the present disclosure, the one or more renewable energy supply sources 114 is directly connected to the plurality of energy storage and supply means 106 associated with the built environment 102. The one or more renewable energy supply sources 114 directly provides DC energy to the plurality of energy storage and supply means 106 without going through any voltage or current conversion process. In another embodiment of the present disclosure, the one or more renewable energy supply sources 114 is connected with the built environment 102 to supply available energy through the use of a direct current to alternating current inverter.

The plurality of energy storage and supply means 106 is configured to store the energy and supply to fulfil energy demand associated with the built environment 102. In an embodiment of the present disclosure, the plurality of energy storage and supply means 106 includes one or more battery cells assembled to create one or more battery packs capable of charging and discharging electric energy. In another embodiment of the present disclosure, the plurality of energy storage and supply means 106 is a high speed flywheel energy storage means. In yet another embodiment of the present disclosure, the plurality of energy storage and supply means 106 is pumped hydro energy storage means.

In yet another embodiment of the present disclosure, the plurality of energy storage and supply means 106 is non-electrical energy storing mediums. In an example, the energy storage and supply means may be comprised of thermal mass or momentum, such that the calculated amount of energy as converted to heat is stored within the energy storage and supply means. In addition, the energy is stored and released at a certain rate using heat transfer or pumping as an energy transfer medium. In another example, a building environment, its construction, envelope and contents are utilized as a means to store, transfer and release energy passively or actively in a form of heat when combined with a means of artificial heating and cooling.

In an embodiment of the present disclosure, the plurality of energy storage and supply means 106 is located at a central location in the built environment 102. The central location associated with the built environment 102 include an electrical room or closet, exterior in a specialized storage cabinet or container and the like. In another embodiment of the present disclosure, the plurality of energy storage and supply means 106 is co-located with each of the plurality of energy consuming devices 104. In yet another embodiment of the present disclosure, the plurality of energy storage and supply means 106 is distributed throughout the built environment 102. In an example, the plurality of energy storage and supply means 106 is distributed in stand-alone forms, plug-in forms and design oriented forms such as furniture or permanent wall hanging forms or picture frames.

In yet another embodiment of the present disclosure, the plurality of energy storage and supply means 106 is built into the building structure or building electrical distribution itself. In yet another embodiment of the present disclosure, the plurality of energy storage and supply means 106 is in a form of thermal heat mass capture and release using calculated capacities of building materials. In yet another embodiment of the present disclosure, the plurality of energy storage and supply means 106 is located outside of the built environment 102 in a micro-grid or fractal grid application.

Going further, the built environment 102 is associated with a plurality of users 128 present inside the built environment 102. The plurality of users 128 may be any human operator, human worker, occupants, data manager, visitors and the like. Each of the plurality of users 128 is associated with a task. For example, the human operators perform the task of monitoring and regulating machines. In another example, the human workers perform the task of cleaning, sweeping and repairing. In yet another example, the occupants are the employees that include managers, attendants, assistants, clerk, security staff and the like. In yet another example, the visitors are civilians present for a specific period of time.

Each of the plurality of users 128 utilizes a pre-defined amount of the energy. The pre-defined amount of the energy pertains to a corresponding energy consuming device of the plurality of energy consuming devices 104. Moreover, each of the plurality of energy consuming devices 104 performs an operation to meet requirements of the plurality of operations associated with the built environment 102. The plurality of operations is associated with operation of each of the plurality of energy consuming devices 104 installed in the built environment 102. The plurality of energy consuming devices 104 may be of any type and size. In addition, the plurality of energy consuming devices 104 include a plurality of electrical devices and a plurality of portable communication devices.

In an embodiment of the present disclosure, the plurality of energy consuming devices 104 may have any electrical and mechanical applications. Examples of the plurality of energy consuming devices 104 include but may not be limited to lighting circuits, refrigeration units, air conditioning systems, information technology networks, gas boilers, hot water heater, escalators, and elevators. The plurality of energy consuming devices 104 consumes a pre-defined amount of the energy based on a power rating, duration of energy usage and the plurality of operations performed. The pre-defined amount of the energy consumed by the plurality of energy consuming devices 104 is based on one or more energy physical variables. The one or more energy physical variables include but may not be limited to a power factor, a phase angle, a power frequency, a voltage, a current load and a power demand.

The one or more energy physical variables of each of the plurality of energy consuming devices 104 is monitored and measured by a plurality of energy metering devices. Each of the plurality of energy consuming devices 104 is combined with the plurality of energy metering devices. In an embodiment of the present disclosure, the plurality of energy metering devices is installed inside each of the plurality of energy consuming devices 104. The plurality of energy metering devices measures each of the one or more energy physical variables in real time. The plurality of energy metering devices include but may not be limited to digital multi-meters, current sensors and wattage meters. In addition, the plurality of energy metering devices facilitates collection of a first set of statistical data associated with the plurality of energy consuming devices 104.

The collection of the first set of statistical data uses a method. In an embodiment of the present disclosure, the method involves digital collection of the first set of statistical data for each of the plurality of energy consuming devices 104. In another embodiment of the present disclosure, the method involves physical collection of the first set of statistical data for each of the plurality of energy consuming devices 104. The plurality of energy metering devices monitors a first plurality of parameters. The first plurality of parameters is associated with the plurality of energy consuming devices 104. The first plurality of parameters includes a set of operational characteristics and a set of physical characteristics. The set of operational characteristics include a current rating, a voltage rating, a power rating, a frequency of operation, an operating temperature and a device temperature. In addition, the set of operational characteristics include a duration of the energy usage by each of the plurality of energy consuming devices 104 in the built environment 102. Moreover, the set of operational characteristics include a seasonal variation in operation and an off-seasonal variation in operation. Further, the set of physical characteristics include a device size, a device area, a device physical location and a portability of device. In an embodiment of the present disclosure, the one or more energy metering devices collects the first set of statistical data. In addition, the first set of statistical data includes a current operational state data and a past operational state data. The current operational state data and the past operational state data corresponds to current energy consumption data and the historical energy consumption data associated with the plurality of energy consuming devices 104 of the built environment 102.

Going further, the plurality of energy consuming devices 104 is associated with the plurality of users 128. The plurality of users 128 interacts with the plurality of energy consuming devices 104 installed in the built environment 102 to perform specific operations. The daily usage and the operating characteristics of the plurality of energy consuming devices 104 are derived from an interface associated with each user of the plurality of users 128. Each of the plurality of energy consuming devices 104 consumes a pre-defined amount of energy during the interface. The pre-defined amount of energy is derived based on an energy consumption behavior and an occupancy pattern of each of the plurality of users 128. In an example, each user of the plurality of users 128 in the built environment 102 may arrive and leave the built environment 102 during certain hours each day. Each user carries one or more portable communication devices both in and out of the built environment 102.

Further, the energy consumption behavior and the occupancy pattern is recorded for each of the plurality of users 128 to obtain a second set of statistical data. The energy consumption behavior and occupancy pattern is collected and recorded by a plurality of occupancy detection means. The plurality of occupancy detection means collect the energy consumption behavior and occupancy pattern associated with the plurality of users 128 in real time. The plurality of occupancy detection means are installed inside and outside of the built environment 102. The plurality of occupancy detection means include a plurality of occupancy sensing devices. The plurality of occupancy sensing devices include occupancy sensors, door state sensors, motion detectors, microphones, radio frequency identification (hereinafter as "RFID"), radio received signal strength indicators (hereinafter as "RSSI") and digital or radio frequency signal processors. Furthermore, the plurality of occupancy detection means include the plurality of sensors 108. The plurality of sensors 108 include carbon-monoxide sensors, carbon-dioxide sensors, heat sensors, pressure sensors, atmospheric pressure sensors, temperature sensors, energy flow sensors, energy fingerprint sensors on monitored loads physical touch point sensors and the like.

The first set of statistical data and the second set of statistical data is transferred to the one or more data collecting devices 110 associated with the built environment 102. The one or more data collecting devices 110 collects the first set of statistical data and the second set of statistical data. The one or more data collecting devices 110 perform digital collection and manual collection. In an embodiment of the present disclosure, each of the one or more data collecting devices 110 is a portable device with an inbuilt API. The inbuilt API of each of the one or more data collection devices 110 is associated with a Global Positioning system (hereafter "GPS"). Further, the inbuilt API of each of the one or more data collection devices 110 is associated with a camera and keypad designed for manual data input from the plurality of users 128. In another embodiment of the present disclosure, each of the one or more data collecting devices 110 is a cellular modem. In yet another embodiment of the present disclosure, each of the one or more data collecting devices 110 is any suitable data gateway device.

The one or more data collecting devices 110 collects a third set of statistical data associated with each of the plurality of energy storage and supply means 106. In an embodiment of the present disclosure, the one or more data collecting devices 110 receives the third set of statistical data from the plurality of energy monitoring devices associated with each of the plurality of energy storage and supply means 106. The plurality of energy monitoring devices monitor a second plurality of parameters associated with the plurality of energy storage and supply means 106. In addition, the plurality of energy monitoring devices collect and transfer the second plurality of parameters associated with the plurality of energy storage and supply means 106 to the one or more data collecting devices 110 in real time. The second plurality of parameters include but may not be limited to charging and discharging rates, temperature characteristics, an energy storage and release capacity associated with the plurality of energy storage.

The one or more data collecting devices 110 is associated with the communication network 116 through an internet connection. The internet connection is established based on a type of network. In an embodiment of the present disclosure, the type of network is a wireless mobile network. In another embodiment of the present disclosure, the type of network is a wired network with a finite bandwidth. In yet another embodiment of the present disclosure, the type of network is a combination of the wireless and the wired network for the optimum throughput of data transmission. The communication network 116 includes a set of channels with each channel of the set of channels supporting a finite bandwidth. The finite bandwidth of each channel of the set of channels is based on a capacity of the communication network 116. The communication network 116 transmits a pre-defined size of the first set of statistical data, the second set of statistical data and the third set of statistical data to the energy demand control system 122. The pre-defined size corresponding to the first set of statistical data, the second set of statistical data and the third set of statistical data is measured in terms of at least one of bits, bytes, kilobytes, megabytes, gigabytes, terabytes and petabytes. Accordingly, the energy demand control system 122 receives the pre-defined size of the first set of statistical data, the second set of statistical data and the third set of statistical data. In addition, the energy demand control system 122 receives another part of the first set of statistical data, the second set of statistical data and the third set of statistical data from the plurality of external APIs 124 and third party databases.

Continuing with FIG. 1, the energy demand control system 122 receives a fourth set of statistical data and a fifth set of statistical data. The energy demand control system 122 receives the fourth set of statistical data from the plurality of environmental sensors 118 through the communication network 116. The plurality of environmental sensors 118 detect and collect environmental and weather conditions associated with the built environment 102 in real time. In addition, the plurality of environmental sensors 118 transfer the environmental and weather conditions to the energy demand control system 122 in real time. In an embodiment of the present disclosure, the plurality of environmental sensors 118 is present inside the built environment 102. In another embodiment of the present disclosure, the plurality of environmental sensors 118 is present outside the built environment 102. Further, the energy demand control system 122 receives the fifth set of statistical data from the plurality of energy pricing models 120. The plurality of energy pricing models 120 is configured to record energy prices associated with the built environment 102.

The energy demand control system 122 receives another part of the fourth set of statistical data and the fifth set of statistical data from the plurality of external APIs 124 and third party databases. The plurality of external APIs 124 and the third party databases are configured to collect, store and transmit weather history and weather forecasts. In addition, the plurality of external APIs 124 and the third party databases are configured to collect, store and transmit billing data, a past energy consumption data and metered energy data. Furthermore, the plurality of external APIs 124 and the third party databases are configured to collect, store and transmit financial or non-financial business data. The financial or non-financial business data comes from business management software. Example of the business management software includes Enterprise Resources Planning (ERP) software.

The energy demand control system 122 analyzes the first set of statistical data, the second set of statistical data, the third set of statistical data, the fourth set of statistical data and the fifth set of statistical data. The analysis is done by performing one or more statistical functions (discussed below in detailed description of FIG. 2). The energy demand control system 122 performs the one or more statistical functions to generate a plurality of statistical results. The plurality of statistical results pertains to the energy consumption (discussed below in detailed description of FIG. 2). The plurality of statistical results obtained from the analysis is used as a reference basis of the energy consumption to score and rank the one or more control schemes for controlling peak loading conditions and abrupt changes in energy pricing.

Further, the energy demand control system 122 displays each of the plurality of statistical results through an application installed in a mobile phone, tablet, smart watch and the like. In another embodiment of the present disclosure, the energy demand control system 122 displays each of the plurality of statistical results on a web page. In yet another embodiment of the present disclosure, the energy demand control system 122 displays each of the plurality of statistical results on a plurality of monitors. Furthermore, the energy demand control system 122 identifies and execute the one or more control schemes to control the peak loading conditions and the abrupt changes in the energy pricing in real time.

The energy demand control system 122 perform scoring of the one or more control schemes. The scoring is performed by evaluating a probabilistic score corresponding to each of the one or more control schemes (explained below in the detailed description of the FIG. 2). Further, the energy demand control system 122 perform ranking of the one or more control schemes. The energy demand control system 122 performs the ranking based on the probabilistic score corresponding to each of the one or more control schemes (explained below in detailed description of FIG. 2).

Further, the energy demand control system 122 transfers the plurality of statistical results along with the one or more control schemes to the one or more statistical monitoring devices 126. In addition, the energy demand control system 122 transfers the probabilistic scores and the ranking corresponding to each of the one or more control schemes to the one or more statistical monitoring devices 126. The one or more statistical monitoring devices 126 is configured to receive and display at least one of the first set of statistical data, the second set of statistical data, the third set of statistical data, the fourth set of statistical data and the fifth set of statistical data. In addition, the one or more statistical monitoring devices 126 are configured to receive and display at least one of the plurality of statistical results and the one or more control schemes for proper monitoring and regulation. Moreover, the one or more statistical monitoring devices 126 are configured to receive and display the probabilistic score and the ranking corresponding to each of the one or more control schemes. The one or more statistical monitoring devices 126 is a device capable of receiving the first set of statistical data, the second set of statistical data, the third set of statistical data, the fourth set of statistical data and the fifth set of statistical data from the energy demand control system 122. Also, the one or more statistical monitoring devices 126 is a device capable of receiving the plurality of statistical results, the one or more control schemes, the probabilistic scores and the rankings from the energy demand control system 122.

It may be noted that in FIG. 1, the energy demand control system 122 transfers the first set of statistical data, the second set of statistical data, the third set of statistical data, the fourth set of statistical data, the fifth set of statistical data, the plurality of statistical results and the one or more control schemes to the one or more statistical monitoring devices 126; however, those skilled in the art would appreciate that the energy demand control system 122 transfers the first set of statistical data, the second set of statistical data, the third set of statistical data, the fourth set of statistical data and the fifth set of statistical data, the plurality of statistical results, the one or more control schemes, the probabilistic scores and the rankings to more number of statistical monitoring devices. Furthermore, it may be noted that in FIG. 1, the built environment 102 is connected to the energy demand control system 122 through the communication network 116; however, those skilled in the art would appreciate that more number of built environments are connected to the energy demand control system 122 through the communication network 116.

FIG. 2 illustrates a block diagram 200 for ranking of the one or more control schemes to control peak loading conditions and abrupt changes in energy pricing of the built environment 102, in accordance with various embodiments of the present disclosure. It may be noted that to explain the system elements of FIG. 2, references will be made to the system elements of the FIG. 1.

The block diagram 200 includes the built environment 102, commercial power supply grid node 112, the one or more renewable energy supply sources 114, the energy demand control system 122 and the plurality of external APIs 124 (as discussed above in detailed description of FIG. 1). In addition, the block diagram 200 includes the plurality of environmental sensors 118 and the plurality of energy pricing models 120 and the one or more statistical monitoring devices 126 (as discussed above in detailed description of FIG. 1). Moreover, the block diagram 200 includes a network based automatic control system 202 and third party databases 206. Furthermore, the energy demand control system 122 includes a server 204. In addition, the server 204 includes a database 204a and a processor 204b.

Each of the plurality of energy consuming devices 104 is associated with one or more energy physical variables (as described above in detailed description of FIG. 1). The one or more energy physical variables defines the energy consumption in the real time based on the load. In an embodiment of the present disclosure, each of the plurality of energy consuming devices 104 is associated with the plurality of energy metering devices. The plurality of energy metering devices digitally measures one or more energy physical variables in the real time to obtain the first set of statistical data (as discussed above in detailed description of FIG. 1). The plurality of energy metering devices includes one or more digital meters, one or more digital current and voltage sensors, the multi-meters, watt-meters, supervisory control and data acquisition (SCADA) and the like.

The energy demand control system 122 collects the first set of statistical data associated with the plurality of energy consuming devices 104 from the plurality of energy metering devices. The first set of statistical data includes a current operational state data associated with the plurality of energy consuming devices 104 and a past operational state data associated with the plurality of energy consuming devices 104. The operational state data is associated with the pre-defined amount of energy consume by each of the plurality of energy consuming devices 104 in real time. The plurality of energy consuming devices 104 consume the pre-defined amount of energy to perform a specific operation (as discussed above in detailed description of FIG. 1).

Further, the energy demand control system 122 fetches the second set of statistical data associated with an occupancy behavior of the plurality of users 128 present inside each of the built environment 102. The energy demand control system 122 fetches the second set of statistical data from the plurality of occupancy detection means. The second set of statistical data includes a first plurality of occupancy data and a second plurality of occupancy data. The first plurality of occupancy data is associated with energy consumption behavior of each of the plurality of users 128 present inside the built environment 102. The second plurality of occupancy data is associated with the occupancy pattern of each of the plurality of users 128 present inside the built environment 102.

The first plurality of occupancy data is associated with interaction between the plurality of energy consuming devices 104 and the plurality of users 128. In an example, a person X check-in to a hotel A. The person X uses the elevator to go upstairs, unlock the room by digital card swap and turns on the lighting and air conditioning unit. The interaction of the person X with the elevator, the digital card swaps door, the lightings and the air conditioning unit results in the pre-defined load consumption. The plurality of users 128 consumes the pre-defined amount of energy associated with the built environment 102.

The second plurality of occupancy data is associated with the occupancy pattern of the plurality of users 128. The occupancy pattern of the plurality of users 128 varies with time, location, weather, season and the like. The occupancy pattern of the plurality of users 128 varies with different zones of the built environment 102. In an example, the occupancy pattern of the plurality of users 128 in shopping malls increases during the festive seasons. In another example, the occupancy pattern at the rugby ground increases during the match day.

The energy consumption behavior and occupancy pattern is recorded and counted by the plurality of occupancy detection means to obtain the second set of statistical data (as described above in detailed description of FIG. 1). In addition, the plurality of occupancy detection means record and count based on the one or more specifications. The one or more specifications include heat signature, identification cards, Bluetooth and the like. In an example, the record of first time visitors and frequent visitors is maintained for faster collection of the second set of statistical data. Further, the energy usage pattern of each of the plurality of users 128 creates a unique and aggregated consumption of the energy. The unique and randomized consumption of the energy is based on a variation in number of the plurality of users 128. The variation in the number of the plurality of users 128 is based on days, months, seasons, events and time of year. In addition, the variation in the number of the plurality of users 128 may be based on architectural configurations of the built environment 102. In an example, the occupancy pattern of the plurality of users 128 in shopping malls increases during the festive seasons. In another example, the occupancy pattern at the soccer ground increases during the match day.

Further, the energy demand control system 122 accumulates the third set of statistical data associated with each of the plurality of energy storage and supply means 106 from the plurality of energy monitoring devices. The third set of statistical data includes a current and historical energy storage and supply capacity data associated with the plurality of energy storage and supply means 106. The plurality of energy monitoring devices record and collect energy storage and supply capacity data associated with the plurality of energy storage and supply means 106 to obtain the third set of statistical data. The energy demand control system 122 accumulates the third set of statistical data based on the second plurality of parameters (as mentioned above in detailed description of FIG. 1).

The energy demand control system 122 receives the fourth set of statistical data from the plurality of environmental sensors 118 associated with the built environment 102 (discussed above in detailed description of FIG. 1). In addition, the energy demand control system 122 receives the fourth set of statistical data from the plurality of external APIs 124 and the third party databases 206. The fourth set of statistical data includes the current and historical environmental condition data of at least one of inside and outside of the built environment 102. The fourth set of statistical data is received by the energy demand control system 122 based on a third plurality of parameters. In an embodiment of the present disclosure, the third plurality of parameters include but may not be limited to a means of recording environmental data having temperature, humidity and air pressure associated with each of the plurality of environmental sensors.

Further, the energy demand control system 122 gathers the fifth set of statistical data from the plurality of energy pricing models 120. The fifth set of statistical data includes current and historical recordings of energy pricing state affecting the built environment 102. The plurality of energy pricing models 120 record and transfer the energy pricing to the energy demand control system 122 in real time through the communication network 116. In addition, the energy demand control system 122 gathers the fifth set of statistical data from the plurality of external APIs 124 and the third party databases 206 (as discussed above in detailed description of FIG. 1). The fifth set of statistical data is gathered based on a fourth plurality of parameters. In an embodiment of the present disclosure, the fourth plurality of parameters include a means of recording energy pricing data having an energy pricing model, an energy price signal associated with the built environment 102.

Going further, the energy demand control system 122 performs the analysis of the first set of statistical data, the second set of statistical data, the third set of statistical data, the fourth set of statistical data and the fifth set of statistical data. The energy demand control system 122 performs the one or more statistical functions to generate the plurality of statistical results. The one or more statistical functions include translating the current operational state data and the past operational state data associated with the plurality of energy consuming devices 104 into energy demand values. In addition, the one or more statistical functions include parsing the first set of statistical data, the second set of statistical data and the third set of statistical data. The energy demand control system 122 develops an energy usage profile. The energy demand control system 122 develops the energy usage profile of each of the plurality of energy consuming devices 104, each of the plurality of energy storage and supply means 106 and each of the plurality of users 128. In addition, the energy demand control system 122 develops the energy usage profile associated with each zone of the floor, each group of zones of floor, each floor of a building and each of the one or more built environments. Further, the one or more statistical functions include imputing one or more data entries in the first set of statistical data, the second set of statistical data and the third set of statistical data. The imputing of the one or more data entries is performed to minimize errors in deriving the energy consumption and demand associated with the built environment 102 for a given time interval. Moreover, the energy demand control system 122 imputes the one or more data entries by using an application of at least one of the statistical regression, interpolation and extrapolation.

The one or more statistical functions include comparing the current operational state data with the past operational state data. The energy demand control system 122 compares the current operational state data with the past operational state data associated with the each of the plurality of energy consuming devices 104. The current operational state data and the past operational state data are compared to determine the potential for improvement in energy consumption of each of the plurality of energy consuming devices 104. In addition, the energy demand control system 122 compares a current energy storage capacity and a past energy storage capacity associated with each of the plurality of energy storage and supply means 106. The current energy storage capacity and the past energy storage capacity are compared to determine the potential for improvement in charge/discharge cycles and energy storage capacity of each of the plurality of energy storage and supply means 106. Further, the one or more statistical functions include comparison of the probabilistic score of each of the one or more control schemes. In addition, the one or more statistical functions include comparison of the rankings associated with each of the one or more control schemes.

Accordingly, the analysis of the first set of statistical data, the second set of statistical data, the third set of statistical data, the fourth set of statistical data and the fifth set of statistical data provides the plurality of statistical results. The plurality of statistical results pertains to the energy consumption. In addition, the plurality of statistical results is based on a statistical data model. The statistical data model provides a complete insight into the energy consumption trend. The plurality of statistical results includes one or more graphs, one or more charts, one or more tables and one or more statistical maps of energy consumption. The plurality of statistical results are obtained as a function of duration of the operations of the plurality of energy consuming devices 104 and energy storage and supply capacity of the plurality of energy storage and supply means 106. In addition, the plurality of statistical results are obtained as a function of environmental conditions, and energy pricing affecting the built environment 102.

In an example, the plurality of statistical results include a table and chart of monthly energy consumption of the built environment 102 and a table of a total monthly variable energy load. In another example, the plurality of statistical results includes a pie chart to show a separation of the energy use in the built environment 102 and a table of energy consumption per month and air conditioner loads. In yet another example, the plurality of statistical results includes a statistical chart depicting a kWh consumption based on load type, a bar graph of expected air conditioner savings and service costs. In yet another example, the plurality of statistical results include a bar chart of gross rental, service and licensing costs of at least one of air conditioning units, air conditioning control means, statistical software and networks. In yet another example, the plurality of statistical results includes the statistical chart of total kWh consumed per room as a function of cold degree days.

Further, the energy demand control system 122 identifies the one or more control schemes for controlling the peak loading conditions and abrupt changes in energy pricing associated with the built environment 102. The energy demand control system 122 identifies the one or more control schemes based on the plurality of statistical results. The one or more control schemes includes a potential operational and non-operational instructions for optimizing the operating state of the plurality of energy consuming devices 104. In addition, the one or more control schemes includes the potential operational and non-operational instructions for improving the energy storage capacity of the plurality of energy storage and supply means 106. The potential operational and non-operational instructions include regulating power supply of each of the plurality of energy consuming devices 104 based on an occupancy pattern, energy demand and architectural design of the built environment 102. In addition, the potential operational and non-operational instructions include regulating energy consumption duration of the plurality of energy consuming devices 104. Moreover, the potential operational and non-operational instructions include notifying a list of malfunctioning devices of the plurality of energy consuming devices 104. Furthermore, the potential operational and non-operational instructions include performing an operation on the plurality of energy consuming devices 104. The operation is selected from a group of operations consisting of upgrading, downgrading, replacing and repairing of the plurality of energy consuming devices 104.

Further, the operational and non-operational instructions include prompting the plurality of energy storage and supply means 106 to start and stop charge cycles at specific time periods for reducing energy consumption costs. In addition, the operational and non-operational instructions include prompting the plurality of energy storage and supply means 106 to start and stop discharge cycles for controlling the peak loading periods. Moreover, the operational and non-operational instructions include regulating the charging and discharging characteristics of each of the plurality of energy storage and supply means 106.

The energy demand control system 122 executes the one or more control schemes identified to counter the peak loading conditions and the abrupt changes in energy pricing associated with the built environment 102. The energy demand control system 122 executes the one or more control schemes to measure the potential improvement in estimated performance of the plurality of energy consuming devices 104 and the plurality of energy storage and supply means 106. In addition, the energy demand control system 122 executes the one or more control schemes to measure the potential degradation in estimated performance of the plurality of energy consuming devices 104 and the plurality of energy storage and supply means 106.

In an embodiment, the energy demand control system 122 executes the one or more control schemes through the network based automatic control system 202. The network based automatic control system 202 is associated with the built environment 102. In addition, the network based automatic control system 202 is associated with a plurality of electrical control relays. In addition, the network based automatic control system 202 is associated with a microprocessor based switches. The network based automatic control system 202 sends one or more control signals based on the one or more control schemes. The network based automatic control system 202 automatically applies the one or more control schemes to the built environment 102. The network based automatic control system 202 controls the operation of each of the plurality of energy consuming devices 104. In addition, the network based automatic control system 202 controls the plurality of energy consuming devices 104 based on the occupancy behavior of the plurality of users 128 and energy storage capacity of the plurality of energy storage and supply means 106. Moreover, the network based automatic control system 202 controls the plurality of energy consuming devices 104 based on weather conditions and real time energy pricing associated with the built environment 102. Furthermore, the network based automatic control system 202 controls the plurality of energy storage and supply means 106 based on the real time energy demand, weather conditions and forecasts, and real time energy pricing associated with the built environment 102.

The energy demand control system 122 performs scoring of each of the one or more control schemes executed to counter the peak loading conditions and the abrupt changes in energy pricing associated with the built environment 102. The energy demand control system 122 performs the scoring by evaluating the probabilistic score corresponding to each of the one or more control schemes. The energy demand control system 122 utilizes one or more scoring formulations to evaluate the probabilistic score for each of the one or more control schemes. The scoring is performed for determining the potential improvement and degradation in estimated performance of the plurality of energy consuming devices 104 and the plurality of energy storage and supply means 106. The one or more control schemes being scored based on a potential impact on control and regulation of peak loading conditions and abrupt changes in the energy pricing.

The energy demand control system 122 analyzes the potential impact of each of the one or more control schemes executed to optimize the time-variant energy demand associated with the built environment 102. In addition, the energy demand control system 122 scores the one or more control schemes by assigning at least one of a positive score, a negative score and a nil score. The positive score is assigned corresponding to the improvement in the estimated performance and efficiency of each of the plurality of energy consuming devices 104 installed in the built environment 102. In addition, the positive score is assigned corresponding to the improvement in the energy storage capacity of the plurality of energy storage and supply means 106 associated with the built environment 102. Further, the negative score is assigned corresponding to the degradation in the estimated performance and efficiency of each of the plurality of energy consuming devices 104 installed in the built environment 102. In addition, the negative score is assigned corresponding to the degradation in the energy storage capacity of the plurality of energy storage and supply means 106 associated with the built environment 102.

Furthermore, the nil score is assigned corresponding to a negligible or insignificant impact in the estimated performance and efficiency of the plurality of energy consuming devices 104 and the plurality of energy storage and supply means 106.

The energy demand control system 122 performs ranking of the one or more control schemes executed to counter the peak loading conditions and the abrupt changes in energy pricing associated with the built environment 102. The energy demand control system 122 performs ranking of the one or more control schemes to determine relevant control schemes for controlling the real time energy demand associated with the built environment 102. In addition, the energy demand control system 122 performs the ranking of the one or more control schemes to prioritize the one or more control schemes for efficiently controlling a specific peak loading condition and specific abrupt change in energy pricing. Further, the energy demand control system 122 performs ranking of the one or more control schemes based on the probabilistic scores assigned to each of the one or more control schemes in real time. The energy demand control system 122 compares the probabilistic scores of each of the control schemes executed to counter a specific peak energy demand situations. In addition, the energy demand control system 122 assigns a rank to each of the one or more control schemes.

Further, the energy demand control system 122 provides the improvement in the scoring and ranking of the one or more control schemes. The improvement in the scoring and ranking is obtained from a learning algorithm. The learning algorithm accelerates assessment and the analysis of one or more data points. The one or more data points are associate with the first set of statistical data, the second set of statistical data, the third set of statistical data, the fourth set of statistical data and the fifth set of statistical data. The energy demand control system 122 utilizes the one or more data points to create a continuous closed control and feedback loop for optimizing the operating state of the plurality of energy consuming devices 104. In addition, the energy demand control system 122 utilizes the one or more data points to create a continuous closed control and feedback loop for improving the energy storage capacity of the plurality of energy storage and supply means 106.

In an example of a building, a compressor associated with an air conditioning unit operates at 6 cycle per hour frequency and 3 minute amplitude or 18 minutes per hour. The energy demand control system 122 monitors and determine an average energy consumption of 200 Watts per compressor per hour corresponding to the 6 cycles per hour frequency and three-minute amplitude. The energy demand control system 122 executes a control scheme X to optimize the energy consumption. The control scheme X signals and instruct the compressor to regulate the operation to 3 cycle per hour frequency and 6 minutes amplitude or 18 minutes per hour. Also, the energy demand control system 122 monitors and determine the average energy consumption of 180 Watts per compressor per hour corresponding to the 3 cycles per hour frequency and 6 minute amplitude. The energy demand control system 122 compares a potential improvement in the average energy consumption and assigns a positive score A to the control scheme X. Further, the energy demand control system 122 continues to incrementally decrease the number of cycles to achieve the optimum energy consumption. The energy demand control system 122 execute another control scheme Y to optimize the energy consumption. The control scheme Y signals and instruct the compressor to further regulate the operation to 2 cycles per hour frequency and 9 minutes amplitude or 18 minutes per hour. The energy demand control system 122 monitors and determine the average energy consumption of 190 Watts per compressor per hour corresponding to the 2 cycles per hour frequency and 9 minutes amplitude. The energy demand control system 122 compares the potential improvement in the average energy consumption and assigns a positive score B to the control scheme Y. Further, the energy demand control system 122 compares the positive score A associated with the control scheme X with the positive score B associated with the control scheme Y. The energy demand control system 122 provide a higher rank to the control scheme X over the control scheme Y due to better improvement in the average energy consumption.

The energy demand control system 122 stores the first set of statistical data, the second set of statistical data, the third set of statistical data, the fourth set of statistical data and the fifth set of statistical data in the database 204a in real time. In addition, the energy demand control system 122 stores the plurality of statistical results and a log file having one or more control schemes in the database 204a in real time. Moreover, the energy demand control system 122 stores the probabilistic score corresponding to each of the one or more control schemes and the rank associated with each of the one or more control schemes in the database 204a in real time.

The energy demand control system 122 updates the first set of statistical data, the second set of statistical data, the third set of statistical data, the fourth set of statistical data and the fifth set of statistical data in real time. In addition, the energy demand control system 122 updates the plurality of statistical results and the log file having one or more control schemes in real time. Moreover, the energy demand control system 122 updates the probabilistic score corresponding to each of the one or more control schemes and the rank associated with each of the one or more control schemes in real time.

The energy demand control system 122 displays the first set of statistical data, the second set of statistical data, the third set of statistical data, the fourth set of statistical data and the fifth set of statistical data on the one or more statistical monitoring devices 126. In addition, the energy demand control system 122 displays the plurality of statistical results and the log file having one or more control schemes on the one or more statistical monitoring devices 126. Moreover, the energy demand control system 122 displays the probabilistic score corresponding to each of the one or more control schemes and the rank associated with each of the one or more control schemes in real time.

FIG. 3 illustrates a block diagram 300 of the energy demand control system 122, in accordance with various embodiment of the present disclosure. It may be noted that to explain the system elements of FIG. 3, references will be made to the system elements of the FIG. 1 and the FIG. 2. The energy demand control system 122 includes a collection module 302, a fetching module 304, an accumulation module 306, a reception module 308, a gathering module 310 and an analyzing module 312. In addition, the energy demand control system 122 includes an identification module 314, an execution module 316 a scoring module 318 and a ranking module 320. Moreover, the energy demand control system 122 includes a storage module 322, an updating module 324 and a displaying module 326. The above mentioned modules are configured for ranking of the one or more control schemes to control the peak loading conditions and abrupt changes in the energy pricing associated with the built environment 102.

The collection module 302 collects the first set of statistical data associated with each of the plurality of energy consuming devices 104 installed in the built environment 102. The first set of statistical data includes the current operational state data and the past operational state data associated with the plurality of energy consuming devices 104. The plurality of energy metering devices collects the first set of statistical data. The plurality of energy metering devices transfer the first set of statistical data to the one or more data collecting devices 110. The one or more data collecting devices 110 transfer the first set of statistical data to the energy demand control system 122 (as explained above in the detailed description of FIG. 1 and FIG. 2).

The fetching module 304 fetches the second set of statistical data associated with the occupancy behavior of the plurality of users 128 present inside the built environment 102. The second set of statistical data includes the energy consumption behavior of each of the plurality of users 128 present inside the built environment 102. In addition, the second set of statistical data includes the occupancy pattern of each of the plurality of users 128 present inside the built environment 102. The plurality of occupancy detection means and the plurality of sensors 108 fetches the second set of statistical data in real time. In addition, the plurality of occupancy detection means and the plurality of sensors 108 transfer the second set of statistical data to the energy demand control system 122 (as discussed above in detailed description of FIG. 1 and FIG. 2).

The accumulation module 306 accumulates the third set of statistical data associated with each of the plurality of energy storage and supply means 106 associated with the built environment 102. The third set of statistical data includes the current and historical energy storage and supply capacity data associated with the plurality of energy storage and supply means 106. The plurality of energy monitoring devices accumulates the energy storage and supply capacity data associated with each of the plurality of energy storage and supply means 106 in real time to obtain the third set of statistical data. In addition, the plurality of energy monitoring devices transfer the third set of statistical data to the energy demand control system 122 (as explained above in detailed description of FIG. 1 and FIG. 2).

The reception module 308 receives the fourth set of statistical data associated with each of the plurality of environmental sensors 118. The fourth set of statistical data includes the current and historical environmental condition data of at least one of inside and outside of the built environment 102. The plurality of environmental sensors 118 record the environmental condition data in real time to obtain the fourth set of statistical data. In addition, the plurality of environmental sensors 118 transfer the fourth set of statistical data to the energy demand control system 122. Moreover, the reception module 308 receives the fourth set of statistical data from the plurality of external APIs 124 and the third party databases 206 (as discussed above in detailed description of FIG. 1 and FIG. 2).

The gathering module 310 gathers the fifth set of statistical data associated with each of the plurality of energy pricing models 120. The fifth set of statistical data includes the current and historical recordings of the energy pricing state affecting the built environment 102. The plurality of energy pricing models 120 record the real time energy pricing state associated with the built environment 102 to obtain the fifth set of statistical data. In addition, the plurality of energy pricing models transfer the fifth set of statistical data to the energy demand control system 122. Moreover, the gathering module 310 gathers the fifth set of statistical data from the plurality of external APIs 124 and the third party databases 206 (as explained above in detailed description of FIG. 1 and FIG. 2).

The analyzing module 312 analyzes the first set of statistical data, the second set of statistical data, the third set of statistical data, the fourth set of statistical data and the fifth set of statistical data. The analyzing module 312 includes a translation module 312*a*, a parsing module 312*b*, an imputing module 312*c* and a comparison module 312*d*. The translation module 312*a* translates the current operational state data and the past operational state data associated with the plurality of energy consuming devices 104 into the energy demand values. In addition, the translation module 312*a* translates the current operational state data and the past operational state data into the energy demand values for the pre-defined interval of time (as discussed in detailed description of FIG. 1 and FIG. 2).

Further, the parsing module 312*b* parses the first set of statistical data, the second set of statistical data and the third set of statistical data. The parsing module 312*b* parses the first set of statistical data, the second set of statistical data and the third set of statistical data based on the physical location of each of the plurality of energy consuming devices 104. In addition, the parsing module 312*b* parses the first set of statistical data, the second set of statistical data and the third set of statistical data based on the occupancy pattern of the plurality of users 128. Moreover, the parsing module 213*b* parses the first set of statistical data, the second set of statistical data and the third set of statistical data based on the weather conditions and real time energy pricing state (as explained above in the detailed description of FIG. 2).

Further, the imputing module 312*c* imputes the one or more data entries in the first set of statistical data, the second set of statistical data and the third set of statistical data (as discussed above in detailed description of FIG. 1 and FIG. 2). Furthermore, the comparison module 312*d* compares the current operational state data with the past operational state data associated with the each of the plurality of energy consuming devices 104. In addition, the comparison module 312*d* compares the current energy storage capacity and the past energy storage capacity associated with each of the plurality of energy storage and supply means 106 (as discussed above in detailed description of FIG. 2).

The analysis is performed to generate the plurality of statistical results associated with the energy consumption of the built environment 102 in real time. The plurality of statistical results includes one or more graphs, one or more charts, one or more tables and one or more statistical maps of the energy consumption as a function of duration of the operations. Further, the plurality of statistical results includes base-load, variable load, the cost of the operations, energy efficiency, the temperature, humidity and daylight. Furthermore, the plurality of statistical results includes the real time occupancy of the plurality of users 128 inside the built environment 102 and physical parameters of each of the plurality of energy consuming devices 104.

The identification module 314 identifies the one or more control schemes for controlling the peak loading conditions and abrupt changes in energy pricing associated with the built environment 102. The identification module 314 identifies the one or more control schemes based on the plurality of statistical results. The one or more control schemes includes the potential operational and non-operational instructions for optimizing the operating state of the plurality of energy consuming devices 104. In addition, the one or more control schemes includes the potential operational and non-operational instructions for improving the energy storage capacity of the plurality of energy storage and supply means 106 (as explained above in detailed description of FIG. 2).

The execution module 316 executes the one or more control schemes identified to counter the peak loading conditions and the abrupt changes in energy pricing associated with the built environment 102. The energy demand control system 122 executes the one or more control schemes to measure the potential improvement and degradation in estimated performance of the plurality of energy consuming devices 104 and the plurality of energy storage and supply means 106. The energy demand control system 122 executes the one or more control schemes through the network based automatic control system 202. The network based automatic control system 202 automatically applies the one or more control schemes to the built environment 102 (as discussed in detailed description of FIG. 2).

The scoring module 318 performs scoring of each of the one or more control schemes executed to counter the peak loading conditions and the abrupt changes in energy pricing associated with the built environment 102. The energy demand control system 122 performs the scoring by evaluating the probabilistic score corresponding to each of the one or more control schemes. The scoring is performed for determining the potential improvement and degradation in estimated performance of the plurality of energy consuming devices 104 and the plurality of energy storage and supply means 106. In addition, the energy demand control system 122 scores the one or more control schemes by assigning at least one of a positive score, a negative score and a nil score (as explained in detailed description of FIG. 2).

The ranking module 320 performs ranking of the one or more control schemes executed to counter the peak loading conditions and the abrupt changes in energy pricing associated with the built environment 102. The energy demand control system 122 performs ranking of the one or more control schemes to determine relevant control schemes for controlling the real time energy demand associated with the built environment 102. In addition, the energy demand control system 122 performs the ranking of the one or more control schemes to prioritize the one or more control schemes for efficiently controlling a specific peak loading condition and specific abrupt change in energy pricing. Further, the energy demand control system 122 performs ranking of the one or more control schemes based on the probabilistic scores assigned to each of the one or more control schemes in real time (as explained in detailed description of FIG. 2).

The storage module 322 stores the first set of statistical data, the second set of statistical data, the third set of statistical data, the fourth set of statistical data and the fifth set of statistical data in the database 204*a* in real time. In addition, the storage module 322 stores the plurality of statistical results and the log file having one or more control schemes in the database 204*a* in real time. Moreover, the storage module 322 stores the probabilistic score corresponding to each of the one or more control schemes and the rank associated with each of the one or more control schemes in real time. The database 204*a* is associated with the server 204 of the energy demand control system 122.

The updating module 324 updates the first set of statistical data, the second set of statistical data, the third set of statistical data, the fourth set of statistical data and the fifth set of statistical data in real time. In addition, the updating module 324 updates the plurality of statistical results and the log file having one or more control schemes in real time. Moreover, the updating module 324 update the probabilistic score corresponding to each of the one or more control schemes and the rank associated with each of the one or more control schemes in real time.

The displaying module 326 displays the first set of statistical data, the second set of statistical data, the third set of statistical data, the fourth set of statistical data and the fifth set of statistical data on the one or more statistical monitoring devices 126. In addition, the displaying module 326 displays the plurality of statistical results and the log file having one or more control schemes on the one or more statistical monitoring devices 126. Moreover, the displaying module 328 displays the probabilistic score corresponding to each of the one or more control schemes and the rank associated with each of the one or more control schemes in real time.

FIG. 4 illustrates a flow chart 400 for intelligently recommending the one or more control schemes to control peak loading conditions and abrupt changes in energy pricing of the one or more built environments, in accordance with various embodiments of the present disclosure. It may be noted that to explain the process steps of flowchart 400, references will be made to the system elements of FIG. 1, FIG. 2 and FIG. 3. It may also be noted that the flowchart 400 may have lesser or more number of steps.

The flowchart 400 initiates at step 402. Following step 402, at step 404, the analyzing module 312 analyzes the first set of statistical data, the second set of statistical data, the third set of statistical data, the fourth set of statistical data and the fifth set of statistical data by performing the one or more statistical functions. Further at step 406, the identification module 314 identifies the one or more control schemes. At step 408, the execution module 316 executes the one or more control schemes. The one or more control schemes are identified and executed to control the peak loading conditions and abrupt changes in the energy pricing. Further at step 410, the scoring module 318 scores the one or more control schemes. In addition, the scoring module 318 evaluates the probabilistic score corresponding to each of the one or more control schemes. At step 412, the ranking module 320 ranks the one or more control schemes. The one or more control schemes are ranked based on the probabilistic score corresponding to each of the one or more control schemes. The flow chart 400 terminates at step 414.

FIG. 5 illustrates a block diagram of a computing device 500, in accordance with various embodiments of the present disclosure. The computing device 500 includes a bus 502 that directly or indirectly couples the following devices: memory 504, one or more processors 506, one or more presentation components 508, one or more input/output (I/O) ports 510, one or more input/output components 512, and an illustrative power supply 514. The bus 502 represents what may be one or more busses (such as an address bus, data bus, or combination thereof). Although the various blocks of FIG. 5 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventors recognize that such is the nature of the art, and reiterate that the diagram of FIG. 5 is merely illustrative of an exemplary computing device 500 that can be used in connection with one or more embodiments of the present invention. Distinction is not made between such categories as "workstation," "server," "laptop," "hand-held device," etc., as all are contemplated within the scope of FIG. 5 and reference to "computing device." The computing device 500 typically includes a variety of computer-readable media. The computer-readable media can be any available media that can be accessed by the computing device 500 and includes both volatile and nonvolatile media, removable and non-removable media. By way of example, and not limitation, the computer-readable media may comprise computer storage media and communication media. The computer storage media includes volatile and nonvolatile, removable and non-removable media implemented in any method or technology for storage of information such as computer-readable instructions, data structures, program modules or other data. The computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 500. The communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 504 includes computer-storage media in the form of volatile and/or nonvolatile memory. The memory 504 may be removable, non-removable, or a combination thereof. Exemplary hardware devices include solid-state memory, hard drives, optical-disc drives, etc. The computing device 500 includes one or more processors that read data from various entities such as memory 504 or the one or more I/O components 512. The one or more presentation components 508 present data indications to a user or other device. Exemplary presentation components include a display device, speaker, printing component, vibrating component, etc. The one or more I/O ports 510 allow the computing device 500 to be logically coupled to other devices including the one or more I/O components 512, some of which may be built in. Illustrative components include a microphone, joystick, game pad, satellite dish, scanner, printer, wireless device, etc.

The present disclosure has many advantages over the existing art. The present disclosure provides technical advantages, economic advantages as well as ancillary benefits. The present disclosure enables the utilization of the energy storage and supply means having relatively smaller size and energy storage capacity for addressing the same time-variant load reduction requirements. In addition, the present disclosure controls a large amount of energy loads or demands and cost associated with the installation and operations. Moreover, the present disclosure provides a stable grid network resulting in stable energy pricing and removing volatility of current power system designs.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is understood that various omissions and substitutions of equivalents are contemplated as circumstance may suggest or render expedient, but such are intended to cover the application or implementation without departing from the spirit or scope of the claims of the present technology.

While several possible embodiments of the invention have been described above and illustrated in some cases, it should be interpreted and understood as to have been presented only by way of illustration and example, but not by limitation. Thus, the breadth and scope of a preferred embodiment should not be limited by any of the above-described exemplary embodiments.

What is claimed is:

1. A computer-implemented method for ranking of a plurality of control schemes to control peak loading conditions and abrupt changes in energy pricing associated with one or more built environments, the computer-implemented method comprising:

analyzing, at an energy demand control system having at least one processor, a first set of statistical data including energy consumption of a plurality of energy consuming devices, a second set of statistical data including an occupancy behavior of a plurality of users of the plurality of energy consuming devices, a third set of statistical data including an energy storage and release capacity of a plurality of energy storage and supply means, a fourth set of statistical data including environmental conditions inside and outside the one or more built environments from a plurality of environmental sensors, and a fifth set of statistical data including a plurality of energy pricing models, the analyzing being performed for determining optimized operating states of the plurality of energy consuming devices and the plurality of energy storage and supply means, and the analyzing being done by performing one or more statistical functions to generate a plurality of statistical results;

identifying, at the energy demand control system, the plurality of control schemes based on the plurality of statistical results, wherein the plurality of control schemes comprises potential operational and non-operational instructions for optimizing operating state of the plurality of energy consuming devices and the plurality of energy storage and supply means;

executing, at the energy demand control system the plurality of control schemes to measure a potential improvement or degradation in estimated performance of the plurality of energy consuming devices and the plurality of energy storage and supply means;

scoring, at the energy demand control system, the plurality of control schemes by evaluating a probabilistic score corresponding to each of the plurality of control schemes for determining the potential improvement and degradation in the estimated performance of the plurality of energy consuming devices and the plurality of energy storage and supply means, the plurality of control schemes being scored based on a potential impact on control and regulation of the peak loading conditions and the abrupt changes in the energy pricing; and ranking, at the energy demand control system, the plurality of control schemes based on the probabilistic score corresponding to each of the plurality of control schemes and wherein the ranking being performed in real time.

2. The computer-implemented method of claim 1, further comprising ranking the plurality of control schemes to determine relevant control schemes and prioritize the plurality of control schemes for efficiently controlling a specific peak loading condition and specific abrupt change in the energy pricing.

3. The computer-implemented method of claim 1, the probabilistic score corresponding to each of the plurality of control schemes being improved by an application of a learning algorithm, wherein the application of the learning algorithm comprises recording of the first set of statistical data pertaining to each of the plurality of energy consuming devices, the second set of statistical data associated with the occupancy behavior of the plurality of users, the third set of statistical data associated with the plurality of energy storage and supply means, the fourth set of statistical data associated with a plurality of environmental sensors and the fifth set of statistical data associated with the plurality of energy pricing models, the first set of statistical data, the second set of statistical data, the third set of statistical data, the fourth set of statistical data and the fifth set of statistical data being recorded based on a type of built environment, a physical location, duration of energy usage for each of a plurality of portable communication devices associated with the plurality of users.

4. The computer-implemented method of claim 1, wherein the one or more statistical functions comprises:

translating current operational state data and past operational state data associated with the plurality of energy consuming devices into energy demand values for a pre-defined interval of time;

parsing the first set of statistical data, the second set of statistical data and the third set of statistical data;

imputing one or more data entries in the first set of statistical data, the second set of statistical data and the third set of statistical data based on a self-learning algorithm; and comparing the current operational state data with the past operational state data of each of the plurality of energy consuming devices and each of the plurality of energy storage and supply means, the probabilistic score and the ranking of each of the plurality of control schemes for determining the potential improvement or degradation in the estimated performance of the plurality of energy consuming devices and the plurality of energy storage and supply means.

5. The computer-implemented method of claim 1, wherein the plurality of statistical results comprises one or more graphs, one or more charts, one or more tables and one or more statistical maps of energy consumption as a function of duration of operations of the plurality of energy consuming devices, energy storage and supply capacity of the plurality of energy storage and supply means, environmental conditions and the energy pricing affecting the one or more built environments.

6. The computer-implemented method of claim 1, wherein the plurality of operational and non-operational instructions comprises:

regulating power supply of each of the plurality of energy consuming devices based on an occupancy pattern, energy demand and architectural design of the one or more built environments;

regulating energy consumption duration of the plurality of energy consuming devices;

performing an operation on the plurality of energy consuming devices, the operation being selected from a group of operations consisting of upgrading, downgrading, replacing and repairing of the plurality of energy consuming devices;

prompting the plurality of energy storage and supply means to start and stop charge cycles at specific time periods for reducing energy consumption costs;

prompting the plurality of energy storage and supply means to start and stop discharge cycles for controlling peak loading periods; and regulating charging and discharging characteristics of each of the plurality of energy storage and supply means.

7. The computer-implemented method of claim 1, further comprising collecting the first set of statistical data including current operational state data associated with the energy consuming devices and a past operational state data associated with the energy consuming devices, the first set of statistical data being collected based on current rating, a voltage rating, a power rating, a frequency of operation, an operating temperature, a device temperature, the duration of operation, a seasonal variation in operation and off-seasonal variation in operation, wherein the set of physical characteristics comprises a device size, a device area, a device physical location and a portability of device.

8. The computer-implemented method of claim 1, further comprising fetching, at the energy demand control system with the processor, the second set of statistical data associated with the occupancy behavior of the plurality of users present inside each of the one or more built environments, wherein the second set of statistical data comprises a first plurality of occupancy data and a second plurality of occupancy data, the first plurality of occupancy data being associated with energy consumption behavior of each of one or more occupants present inside the one or more built environments and the second plurality of occupancy data being associated with an occupancy pattern of each of the one or more occupants present inside the one or more built environments.

9. The computer-implemented method of claim 1, further comprising accumulating, at the energy demand control system with the processor, the third set of statistical data associated with each of the plurality of energy storage and supply means, wherein the third set of statistical data comprises a current and historical energy storage and supply capacity data associated with the plurality of energy storage and supply means, the accumulation of the third set of statistical data being performed based on charging and discharging rates, temperature characteristics, an energy storage and release capacity, charge current, charge level, discharge current, idle time and depth of discharge associated with the plurality of energy storage and supply means.

10. The computer-implemented method of claim 1, further comprising receiving, at the energy demand control system with the processor, the fourth set of statistical data associated with each of the plurality of environmental sensors present inside or outside the one or more built environments, wherein the fourth set of statistical data comprises a current and historical environmental condition data of the inside or outside the one or more built environments, the reception of the fourth set of statistical data being performed based on environmental data comprising temperature, humidity and air pressure associated with each of the plurality of environmental sensors present inside or outside the one or more built environments, the environmental data being obtained from a plurality of external application programming interfaces and a plurality of third party databases.

11. The computer-implemented method of claim 1, further comprising gathering, at the energy demand control system with the processor, the fifth set of statistical data associated with each of the plurality of energy pricing models, wherein the fifth set of statistical data comprises current and historical recordings of energy pricing state affecting the one or more built environments, the gathering of the fifth set of statistical data being based on pricing data including an energy pricing model or an energy price signal associated with the one or more built environments, the energy pricing data being obtained from a plurality of external application programming interfaces and a plurality of third party databases.

12. The computer-implemented method of claim 1, further comprising storing, at the energy demand control system with the processor, the first set of statistical data, the second set of statistical data, the third set of statistical data, the fourth set of statistical data, the fifth set of statistical data, the plurality of statistical results, the probabilistic score corresponding to each of the plurality of control schemes, the rank associated with each of the plurality of control schemes and a log file having the operational and non-operational instructions in a database.

13. The computer-implemented method of claim 1, further comprising updating, at the energy demand control system with the processor, the first set of statistical data, the second set of statistical data, the third set of statistical data, the fourth set of statistical data, the fifth set of statistical data, the plurality of statistical results, the probabilistic score corresponding to each of the plurality of control schemes, the rank associated with each of the plurality of control schemes and a log file having the operational and non-operational instructions.

14. The computer-implemented method of claim 1, further comprising displaying, at the energy demand control system with the processor, the first set of statistical data, the second set of statistical data, the third set of statistical data, the fourth set of statistical data, the fifth set of statistical data, the plurality of statistical results, the probabilistic score corresponding to each of the plurality of control schemes, the rank associated with each of the plurality of control schemes and a log file having the operational and non-operational instructions.

15. A computer system comprising:
one or more processors; and
a memory coupled to the one or more processors, the memory for storing instructions which, when executed by the one or more processors, cause the one or more processors to perform a method for ranking of a plurality of control schemes for controlling peak loading conditions and abrupt changes in energy pricing associated with one or more built environments, the method comprising:
analyzing, at an energy demand control system, a first set of statistical data associated with a plurality of energy consuming devices, a second set of statistical data associated with an occupancy behavior of a plurality of users, a third set of statistical data associated with a plurality of energy storage and supply means, a fourth set of statistical data associated with a plurality of environmental sensors and a fifth set of statistical data associated with a plurality of energy pricing models, the analyzing being performed for determining optimized operating states of the plurality of energy consuming devices and the plurality of energy storage and supply means and the analyzing being done by performing one or more statistical functions to generate a plurality of statistical results;

identifying, at the energy demand control system, the plurality of control schemes for controlling the peak loading conditions and the abrupt changes in the energy pricing associated with the one or more built environments, the plurality of control schemes being identified based on the plurality of statistical results, wherein the plurality of control schemes comprises potential operational and non-operational instructions for optimizing the operating states of the plurality of energy consuming devices and the plurality of energy storage and supply means;

executing, at the energy demand control system, the plurality of control schemes to counter the peak loading conditions and the abrupt changes in the energy pricing associated with the one or more built environments, the plurality of control schemes being executed to measure a potential improvement or degradation in estimated performance of the plurality of energy consuming devices and the plurality of energy storage and supply means;

scoring, at the energy demand control system, the plurality of control schemes executed to counter the peak loading conditions and the abrupt changes in the energy pricing associated with the one or more built environments, the scoring being performed by evaluating a probabilistic score corresponding to each of the plurality of control schemes for determining the potential improvement and degradation in the estimated performance of the plurality of energy consuming devices and the plurality of energy storage and supply means, the plurality of control schemes being scored based on a potential impact on control and regulation of the peak loading conditions and the abrupt changes in the energy pricing; and ranking, at the energy demand control system, the plurality of control schemes for controlling the peak loading conditions and the abrupt changes in the energy pricing associated with the one or more built environments, the plurality of control schemes being ranked based on the probabilistic score corresponding to each of the plurality of control schemes.

16. The computer system of claim 15, further comprising storing, at the energy demand control system, the first set of statistical data, the second set of statistical data, the third set of statistical data, the fourth set of statistical data, the fifth set of statistical data, the plurality of statistical results, the rank associated with each of the plurality of control schemes, the probabilistic score corresponding to each of the plurality of control schemes and a log file having the operational and non-operational instructions in a database.

17. The computer system of claim 15, further comprising updating, at the energy demand control system with the processor, the first set of statistical data, the second set of statistical data, the third set of statistical data, the fourth set of statistical data, the fifth set of statistical data, the plurality of statistical results, the rank associated with each of the plurality of control schemes, the probabilistic score corresponding to each of the plurality of control schemes and a log file having the operational and non-operational instructions.

18. A non-transitory computer-readable storage medium encoding computer executable instructions that, when executed by at least one processor, performs a method for ranking of a plurality of control schemes for controlling peak loading conditions and abrupt changes in energy pricing associated with one or more built environments, the method comprising:

analyzing, at a computing device, a first set of statistical data associated with a plurality of energy consuming devices, a second set of statistical data associated with an occupancy behavior of a plurality of users, a third set of statistical data associated with a plurality of energy storage and supply means, a fourth set of statistical data associated with a plurality of environmental sensors and a fifth set of statistical data associated with a plurality of energy pricing models, the analyzing being performed for determining optimized operating states of the plurality of energy consuming devices and the plurality of energy storage and supply means and the analyzing being done by performing one or more statistical functions to generate a plurality of statistical results;

identifying, at the computing device, the plurality of control schemes for controlling the peak loading conditions and the abrupt changes in the energy pricing associated with the one or more built environments, the plurality of control schemes being identified based on the plurality of statistical results, wherein the plurality of control schemes comprises potential operational and non-operational instructions for optimizing the operating states of the plurality of energy consuming devices and the plurality of energy storage and supply means;

executing, at the computing device, the plurality of control schemes to counter the peak loading conditions and the abrupt changes in the energy pricing associated with the one or more built environments, the plurality of control schemes being executed to measure a potential improvement or degradation in estimated performance of the plurality of energy consuming devices and the plurality of energy storage and supply means;

scoring, at the computing device, the plurality of control schemes executed to counter the peak loading conditions and the abrupt changes in the energy pricing associated with the one or more built environments, the scoring being performed by evaluating a probabilistic score corresponding to each of the plurality of control schemes for determining the potential improvement and degradation in the estimated performance of the plurality of energy consuming devices and the plurality of energy storage and supply means, the plurality of control schemes being scored based on a potential impact on control and regulation of the peak loading conditions and the abrupt changes in the energy pricing; and ranking, at the computing device, the plurality of control schemes for controlling the peak loading conditions and the abrupt changes in the energy pricing associated with the one or more built environments, the plurality of control schemes being ranked based on the probabilistic score corresponding to each of the plurality of control schemes.

19. The non-transitory computer readable storage medium of claim 18, further comprising instructions for storing at the computing device, the first set of statistical data, the second set of statistical data, the third set of statistical data, the fourth set of statistical data, the fifth set of statistical data, the plurality of statistical results, the rank associated with each of the plurality of control schemes, the probabilistic score corresponding to each of the plurality of control schemes and a log file having the operational and non-operational instructions in a database.

20. The non-transitory computer readable storage medium of claim 18, further comprising instructions for updating at the computing device, the first set of statistical data, the second set of statistical data, the third set of statistical data, the fourth set of statistical data, the fifth set of statistical data, the plurality of statistical results, the rank associated with each of the plurality of control schemes, the probabilistic score corresponding to each of the plurality of control schemes and a log file having the operational and non-operational instructions.

* * * * *